US010913997B2

United States Patent
Kurokawa et al.

(10) Patent No.: US 10,913,997 B2
(45) Date of Patent: Feb. 9, 2021

(54) ARC EVAPORATION SOURCE (71) Applicant: Kobe Steel, Ltd., Hyogo (JP)

(72) Inventors: Yoshinori Kurokawa, Takasago (JP); Satoshi Hirota, Takasago (JP); Shinichi Tanifuji, Takasago (JP)

(73) Assignee: Kobe Steel, Ltd., Hyogo (JP)

( * ) Notice: Subject to any disclaimer, the term of this patent is extended or adjusted under 35 U.S.C. 154(b) by 489 days.

(21) Appl. No.: 15/321,227

(22) PCT Filed: Jul. 3, 2015

(86) PCT No.: PCT/JP2015/069340
§ 371 (c)(1),
(2) Date: Dec. 22, 2016

(87) PCT Pub. No.: WO2016/017374
PCT Pub. Date: Feb. 4, 2016

(65) Prior Publication Data
US 2017/0204507 A1 Jul. 20, 2017

(30) Foreign Application Priority Data

Jul. 30, 2014 (JP) .................................. 2014-154722
Feb. 26, 2015 (JP) .................................. 2015-036107

(51) Int. Cl.
C23C 14/24 (2006.01)
C23C 14/32 (2006.01)
H01J 37/32 (2006.01)

(52) U.S. Cl.
CPC ............ *C23C 14/243* (2013.01); *C23C 14/32* (2013.01); *C23C 14/325* (2013.01);
(Continued)

(58) Field of Classification Search
CPC ..... C23C 14/32; C23C 14/325; C23C 14/243; H01J 37/3266; H01J 37/32055; H01J 37/32669
(Continued)

(56) References Cited

U.S. PATENT DOCUMENTS 4,492,845 A * 1/1985 Kljuchko ............. C23C 14/325
204/192.38
4,556,471 A * 12/1985 Bergman ............. C23C 14/325
204/298.41
(Continued)

FOREIGN PATENT DOCUMENTS

JP H04-221064 A 8/1992
JP 2001-152319 A 6/2001
(Continued)

OTHER PUBLICATIONS

International Search Report issued in PCT/JP2015/069340; dated Sep. 1, 2015.
(Continued)

*Primary Examiner* — Eric S Stapleton
(74) *Attorney, Agent, or Firm* — Studebaker & Brackett PC (57) ABSTRACT

Provided is an arc evaporation source capable of stably retaining an arc spot on the front end surface of a target and apparatus downsizing. An arc evaporation source includes a target to be melted and vaporized from its front end surface by arc discharge and at least one magnet disposed apart from a side surface of the target radially thereof. The magnet is disposed to form a magnetic field satisfying conditions a) and b) below, on the side surface, in a region of up to 10 mm from the front end surface axially of the target: a) an angle which magnetic lines of force forms with the side surface of the target is 45 degrees or less; and b) a component of the
(Continued)

strength of the magnetic lines of force along the axial direction of the target is 200 G or more.

13 Claims, 11 Drawing Sheets

(52) U.S. Cl.
CPC .... *H01J 37/32055* (2013.01); *H01J 37/3266* (2013.01); *H01J 37/32669* (2013.01)

(58) Field of Classification Search
USPC .......................................................... 392/388
See application file for complete search history.

(56) References Cited

U.S. PATENT DOCUMENTS

| | | | | |
|---|---|---|---|---|
| 4,767,931 | A * | 8/1988 | Sato | H01J 37/32055 204/298.04 |
| 4,839,011 | A * | 6/1989 | Ramalingam | C23C 14/0021 204/192.38 |
| 4,891,560 | A * | 1/1990 | Okumura | H01J 37/3266 204/298.19 |
| 5,015,493 | A * | 5/1991 | Gruen | C23C 14/32 204/298.05 |
| 5,160,595 | A * | 11/1992 | Hauzer | C23C 14/325 204/192.12 |
| 5,279,723 | A * | 1/1994 | Falabella | C23C 14/221 204/192.38 |
| 5,480,527 | A * | 1/1996 | Welty | C23C 14/221 118/723 VE |
| 5,618,590 | A * | 4/1997 | Naruse | C23C 14/0688 204/192.16 |
| 5,843,293 | A * | 12/1998 | Murakami | C23C 14/325 204/298.41 |
| 6,103,074 | A * | 8/2000 | Khominich | C23C 14/228 204/192.38 |
| 6,334,405 | B1 * | 1/2002 | Takahara | H01J 37/32055 118/723 VE |
| 6,350,356 | B1 * | 2/2002 | Welty | C23C 14/325 204/298.11 |
| 6,351,075 | B1 * | 2/2002 | Barankova | H01J 37/32055 118/723 MA |
| 6,440,282 | B1 * | 8/2002 | Wada | H01J 37/3408 204/298.17 |
| 6,511,585 | B1 * | 1/2003 | Shi | H01J 27/14 118/723 VE |
| 6,638,403 | B1 * | 10/2003 | Inaba | C23C 14/325 118/723 HC |
| 6,875,326 | B2 * | 4/2005 | Inaba | C23C 14/325 118/723 HC |
| 7,060,167 | B2 * | 6/2006 | Murakami | H01J 37/32055 204/192.38 |
| 7,498,587 | B2 * | 3/2009 | Welty | H01J 37/32055 118/723 VE |
| 7,857,948 | B2 * | 12/2010 | Ramm | C23C 14/325 204/192.38 |
| 8,685,213 | B2 * | 4/2014 | Kouznetsov | C23C 14/35 204/192.12 |
| 9,165,749 | B2 * | 10/2015 | Krassnitzer | C23C 14/325 |
| 9,200,360 | B2 * | 12/2015 | Tanifuji | C23C 14/325 |
| 9,257,263 | B2 * | 2/2016 | Gorokhovsky | C23C 14/0605 |
| 2002/0125127 | A1 * | 9/2002 | Watanabe | C23C 14/35 204/298.2 |
| 2004/0094411 | A1 * | 5/2004 | Chistyakov | C23C 14/228 204/298.07 |
| 2004/0112736 | A1 * | 6/2004 | Larrinaga | C23C 14/325 204/192.38 |
| 2004/0124080 | A1 * | 7/2004 | Murakami | H01J 37/32055 204/298.41 |
| 2004/0157090 | A1 * | 8/2004 | Yamamoto | C23C 14/06 428/698 |
| 2006/0137978 | A1 * | 6/2006 | Curtins | C23C 14/325 204/298.41 |
| 2006/0152162 | A1 * | 7/2006 | Madocks | H01J 27/146 315/111.21 |
| 2006/0175190 | A1 * | 8/2006 | Schuetze | H01J 37/32055 204/192.38 |
| 2006/0177599 | A1 * | 8/2006 | Madocks | C23C 14/32 427/569 |
| 2006/0237309 | A1 * | 10/2006 | Goikoetxea Larrinaga | C23C 14/325 204/298.41 |
| 2006/0278518 | A1 * | 12/2006 | Kouznetsov | C23C 14/345 204/192.1 |
| 2007/0023282 | A1 * | 2/2007 | Murakami | C23C 14/325 204/298.41 |
| 2007/0029188 | A1 * | 2/2007 | Gorokhovsky | C23C 14/0605 204/192.38 |
| 2007/0119701 | A1 * | 5/2007 | Chistyakov | C23C 14/35 204/192.1 |
| 2007/0175749 | A1 * | 8/2007 | Schneider | C23C 14/35 204/192.1 |
| 2007/0251816 | A1 * | 11/2007 | Welty | H01J 37/32055 204/192.38 |
| 2008/0110749 | A1 * | 5/2008 | Krassnitzer | C23C 14/325 204/192.38 |
| 2009/0050059 | A1 * | 2/2009 | Goikoetxea Larrinaga | C23C 14/243 118/726 |
| 2009/0139853 | A1 * | 6/2009 | Yamamoto | C23C 14/35 204/192.1 |
| 2010/0083901 | A1 * | 4/2010 | Meyer | C23C 14/325 118/723 E |
| 2010/0213055 | A1 * | 8/2010 | Vetter | H01J 37/32055 204/298.41 |
| 2010/0294656 | A1 * | 11/2010 | Ikeda | H01J 37/32091 204/298.11 |
| 2011/0011734 | A1 * | 1/2011 | Marunaka | C23C 14/32 204/192.11 |
| 2011/0308941 | A1 * | 12/2011 | Krassnitzer | C23C 14/325 204/298.41 |
| 2012/0037493 | A1 * | 2/2012 | Tanifuji | C23C 14/325 204/192.38 |
| 2013/0098881 | A1 * | 4/2013 | Tanifuji | C23C 14/325 219/121.11 |
| 2013/0327642 | A1 * | 12/2013 | Tanifuji | C23C 14/325 204/298.41 |
| 2014/0246325 | A1 * | 9/2014 | Tsuchiya | H01J 37/32055 205/122 |
| 2015/0122644 | A1 * | 5/2015 | Tanifuji | C23C 14/325 204/298.16 |

FOREIGN PATENT DOCUMENTS

| | | |
|---|---|---|
| JP | 2005-002454 A | 1/2005 |
| JP | 2007-070690 A | 3/2007 |
| JP | 2012-188730 A | 10/2012 |
| JP | 2012-188732 A | 10/2012 |
| WO | 2013/191038 A1 | 12/2013 |

OTHER PUBLICATIONS

The extended European search report issued by the European Patent Office dated Mar. 21, 2017, which corresponds to European Patent Application No. 15827912.5-1551 and is related to U.S. Appl. No. 15/321,227.
Notification of Transmittal of Translation of the International Preliminary Report on Patentability and Translation of Written Opinion of the International Searching Authority; PCT/JP2015/069340; dated Feb. 9, 2017.

* cited by examiner

DISTANCE FROM FRONT END SURFACE X(mm)

DISTANCE FROM FRONT END SURFACE X(mm)

ARC EVAPORATION SOURCE

TECHNICAL FIELD

The present invention relates to an arc evaporation source.

BACKGROUND ART

As a method of forming a film on the surface of a substrate such as a tool or a machine part for the purpose of enhancing abrasion resistance or the like, conventionally known is a method of depositing a film on the surface of the substrate by use of arc discharge. As a material of such a film, there may be used, for example, a rod-shaped target in order to allow a continuous film deposition to be performed.

Patent Literature 1 discloses an arc evaporation source having a rod-shaped target. In the case of a deposition by use of an arc discharge such as AIP, the front end surface of the rod-shaped target in the arc evaporation source is melted and evaporated by the arc discharge. Thus melted and evaporated material adheres on the surface of the substrate.

During the film deposition, the spot at which the arc discharge is caused in the front end surface of the target, namely, a target spot, makes an unstable movement. This causes the possibility that the arc spot deviates from the area of the front end surface of the target and makes an unexpected or stray movement toward the side surface of the target or away from the target. In this case, the deposition system has to automatically stop the arc discharge, which may hinder a continuous deposition.

To constrain the arc spot within the area of the front end surface of the target, the arc evaporation source disclosed in Patent Literature 1 includes an annular coil for magnetic field generation, the coil being disposed around the target coaxially with the target. In the magnetic field generated by the coil, there are formed magnetic lines of force extending from the front end surface of the target substantially in a normal direction thereof. The magnetic lines of force thus extending from the front end surface of the target in the normal direction constrains the arc spot within the area of the front end surface of the target.

There is recently a case where a carbon-made target is used for a film deposition. In this case, the arc spot makes a more unstable movement, which grows the tendency of deviating from the front end surface of the target. This requires stronger magnetic lines of force for constraining the arc spot within the front end surface of the target.

However, the disposition of a magnetic field generation coil around a rod-shaped target such as the arc evaporation source disclosed in Patent Literature 1 requires the coil and/or equipment around the coil to be upsized for generating strong magnetic lined of force, thus generating a problem of increase in a product cost of the arc evaporation source.

CITATION LIST

Patent Literature

PTL 1: Japanese Unexamined Patent Application Publication (Translation of PCT Application) No. 2007-070690

SUMMARY OF INVENTION

It is an object of the present invention to provide an arc evaporation source capable of stably restricting an arc spot on a front end surface of a target with restricted equipment upsizing.

To solve the above problem, the inventors have conducted extensive research, resulting in finding that the magnetic field formed by a magnet only has to simultaneously satisfy a first condition that the angle of magnetic lines of force with respect to the side surface of the target is lower than a specific magnitude and a second condition that the magnitude of a component of magnetic lines of force in an axial direction of the target is equal to or greater than a specific magnitude, in order to constrain the arc spot within the area of the front end surface of the target. In addition, the inventors has found that disposing the magnet so as to allow the magnet to generate magnetic field satisfying the above conditions makes it possible to restrict equipment upsizing.

The arc evaporation source according to the invention includes:

a target to be melted and evaporated from a front end surface of the target by arc discharge; and at least one magnet disposed at a position apart from a side surface of the target radially of the target, the side surface being continuous with a periphery of the front end surface of the target, wherein the magnet is disposed so as to form a magnetic field that satisfies conditions a) and b) below, on the side surface of the target, in a region of up to 10 mm from the front end surface of the target in an axial direction of the target, the axial direction being normal to the front end surface:

a) an angle which magnetic lines of force of the magnetic field forms with the side surface of the target is 45 degrees or less; and b) a component of the strength of the magnetic lines of force along the axial direction of the target is 200 G or more.

DESCRIPTION OF EMBODIMENTS

There will be described below embodiments of the arc evaporation source of the present invention more specifically with reference to accompanying drawings.

Figure 1:
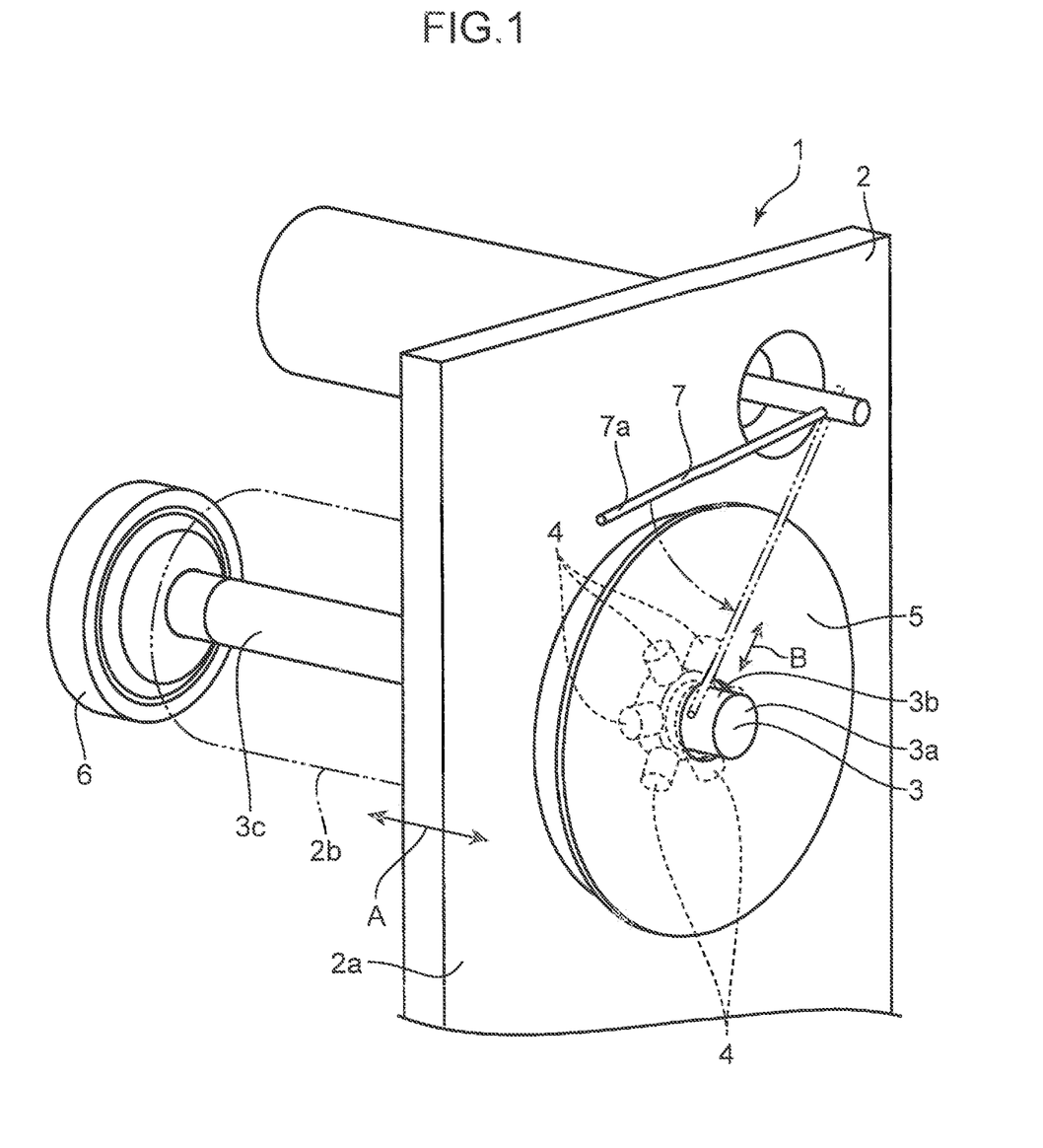
FIG. 1 is a perspective-view diagram of an arc evaporation source according to an embodiment of the present invention.
Figure 2:
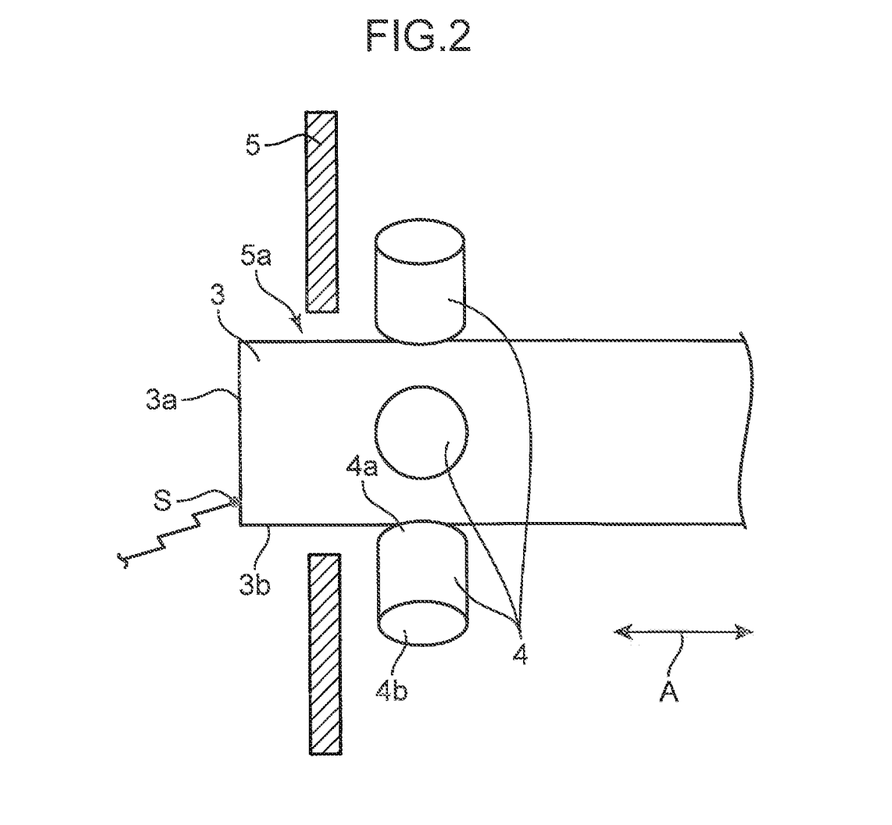
FIG. 2 is a diagram showing a target and magnets of FIG. 1 as viewed from the side surface of the target.
Figure 3:
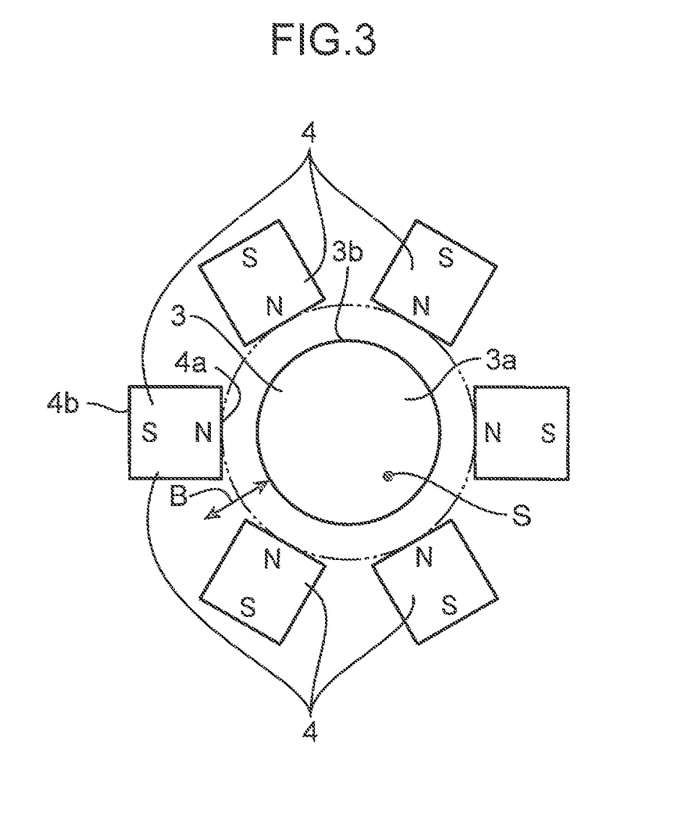
FIG. 3 is a diagram showing the target and magnets of FIG. 1 as viewed from the front end surface of the target.

FIGS. 1 to 3 show an arc evaporation source 1, which includes: a main body 2; a rod-shaped target 3 made of carbon; a plurality of magnets 4 disposed around the target 3 in a radial arrangement; a shield plate 5 that protects the magnets 4 against arc discharge; a feeding unit 6 that feeds the target 3 in the axial direction A; and an ignition device 7 that initiates arc discharge at the target 3.

The main body 2 has a main plate 2a and a cylindrical portion 2b. The main plate 2a is disposed inside a chamber (not shown) of a film-forming apparatus. The cylindrical portion 2b is disposed outside the chamber, on the back side of the main plate 2a. The front end portion of the rod-shaped target 3 passes through the main plate 2a and the shield plate 5 to be exposed inside the chamber. The remaining portion 3c of the target 3 is accommodated inside the cylindrical portion 2b. The shield plate 5 has a through-hole 5a through which the target 3 passes.

The rod-shaped target 3, which is made of carbon, is cylindrical, specifically having a circular front end surface 3a and a side surface 3b that is continuous with the peripheral edge of the front end surface 3a. The target 3 has a diameter of about 10 to 30 mm. The length of the target 3 is sufficiently greater than the diameter of the target 3. In the case of a target 3 made of carbon, an arc spot S (see FIG. 2) rotates slowly (one rotation per several seconds) within the circular target front end surface 3a, thus not tending to move randomly within the front end surface as in the case of a metallic target. Hence, in the case of a carbon-made target with a large diameter and a shape similar to flat plate, the film thickness distribution during film formation may be brought into unevenness, causing a possibility that the front end surface is prevented from uniform consummation while only a corner part thereof is consumed. To solve this problem, it is preferable that the diameter of the target 3 is about 10 to 30 mm, as described above, in the case of a carbon-made target.

It is also possible that the target 3 has a shape other than a rod-shaped shape (for instance, various three-dimensional shapes wherein the length of the target 3 is not sufficiently larger than the diameter of the target 3, for example as in a plate-like shape).

The target 3 is made of a material containing carbon; for example, it can be produced from a pure carbon substance, or from a mixture of carbon with other substances.

The target 3 is melted and vaporized from the front end surface 3a by arc discharge in the chamber of the film-forming apparatus, in order to deposit a film on the surface of a substrate. The arc discharge is initiated when a contact bar 7a of the ignition device 7 comes into contact with the target 3. The target 3 is automatically fed by the feeding unit 6 in the axial direction A perpendicular to the front end surface 3a, so as to protrude into the chamber by a length equal to the length of the molten part of the target. This allows the front end surface 3a of the target 3 to be maintained at a predetermined position regardless of the consummation of the target 3.

When vaporized by arc discharge, the target 3 made of carbon used in the present embodiment involves less temperature increase, as compared with targets made up of other materials (for instance metals). The arc evaporation source 1, therefore, requires no mechanism for cooling the target 3. Meanwhile, the target is also permitted to be made of a material other than carbon (for instance, a metal-made target of tungsten carbide or the like described below).

Each of the plurality of magnets 4 has magnetic poles 4a, 4b of mutually different polarities. The plurality of magnets 4 are disposed so as to align the magnetic poles 4a, 4b of mutually different polarities in the radial direction B of the target 3, at respective positions apart from the side surface 3b of the target 3 in the radial direction B of the target 3. The magnets 4 generate a magnetic field MF1 (FIGS. 4 to 5) that satisfies conditions a) and b) described below. Each of the magnetic pole 4a opposed to the side surface 3b of the target 3 is an N-pole, while each of the magnetic pole 4b facing outward in the radial direction B of the target 3 is an S-pole.

The plurality of magnets 4 are attached to the main plate 2a of the main body 2 so as to be spaced at regular intervals in the circumferential direction of the target 3. This makes it possible to distribute a magnetic field MF1 generated by the magnets 4 uniformly in the circumferential direction of the target 3, on the side surface 3b of the target 3.

Figure 4:
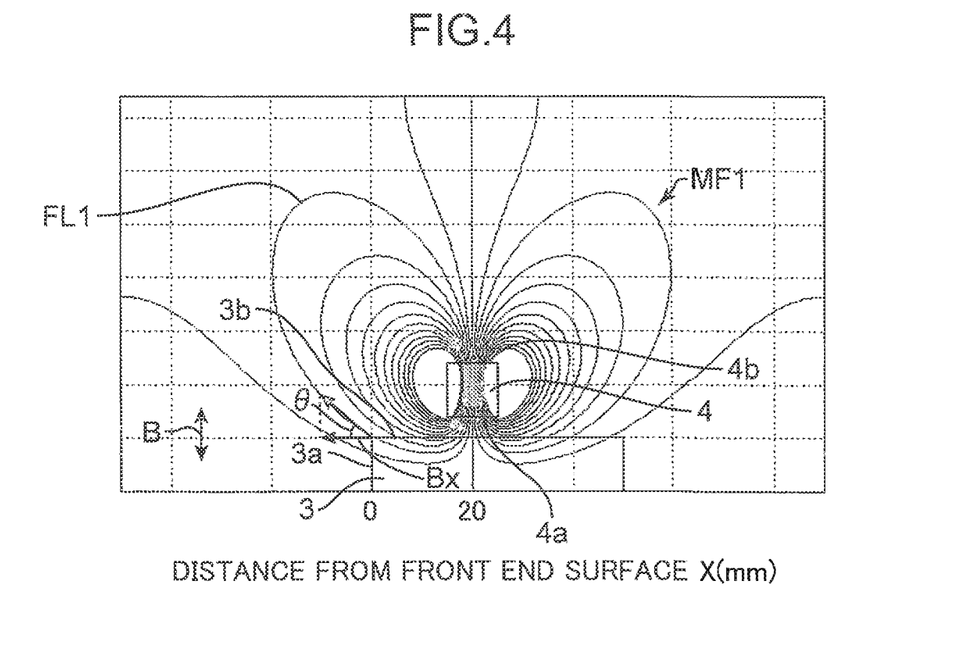
FIG. 4 is a diagram showing a magnetic field generated by the magnets of FIG. 1.

The magnets 4 are disposed on a rear side of the front end surface 3a of the target 3, in the axial direction A of the target 3. For instance, as shown in FIG. 4, the magnets 4 are disposed so as to locate their respective centers at respective positions 20 mm rearward (rightward in FIG. 4) apart from the front end surface 3a of the target 3. This makes it possible to surely generate a magnetic field MF1 satisfying conditions a) and b) described below and further to allay adhesion, onto the magnets 4, of molten material flying off the front end surface 3a of the target 3. The magnets 4 does not have to be disposed on the rear side of the front end surface 3a of the target 3 in the axial direction A of the target 3, if being capable of forming the magnetic field MF1 that satisfies conditions a) and b). For instance, it is also allowable that a part of the magnet 4 projects frontward (specifically, in the direction in which the front end surface 3a in FIG. 4 faces (leftward direction in FIG. 4)) beyond the front end surface 3a.

As shown in FIG. 2, there is a shield plate 5 interposed between the front end surface 3a of the target and the magnets 4.

Each of the magnets 4 is formed of a permanent magnet that generates strong magnetic forces; for instance, it can be produced of an alloy that contains neodymium (for example, NdFeB). Permanent magnets containing neodymium, in spite of their small sizes, can generate strong magnetic lines of force FL1 that satisfy conditions a) and b) described below. Permanent magnets that generate strong magnetic forces are produced also of alloys containing samarium and cobalt (SmCo).

The magnets 4, each being made of a permanent magnet, is allowed to be downsized than electromagnets having coils. This increases a degree of flexibility in arrangement of the magnets 4 and allows downsizing of the arc evaporation source 1 to be more reliably achieved.

Figure 5:
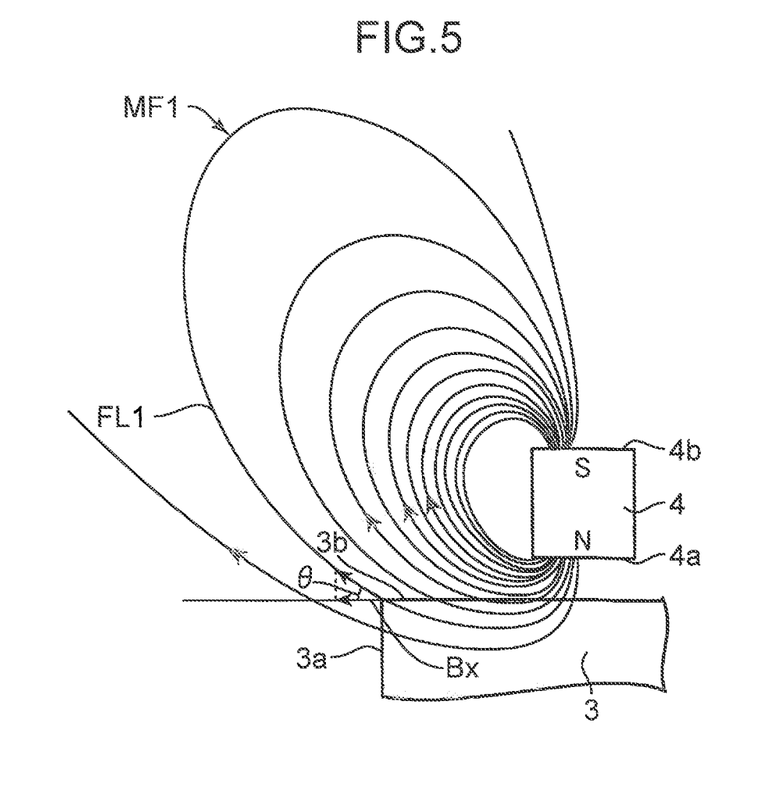
FIG. 5 is a diagram of an enlarged portion between a target front end surface and a magnet in the magnetic field of FIG. 4.

The magnets 4, being disposed in a radial arrangement apart from the side surface 3b of the target 3 so as to align the magnetic poles 4a, 4b in the radial direction Bt, generate the magnetic field MF1 shown in FIGS. 4 to 5 on the side surface 3b of the target 3. In FIG. 4 the magnets 4 are disposed on the rear side of the front end surface 3a of the target 3; specifically, disposed so as to locate their respective centers at respective positions 20 mm rearward apart from the front end surface 3a of the target 3. However, the positional relationship of the magnets 4 with respect to the front end surface 3a according to the present invention is not limited to that.

The magnetic lines of force FL1 of the magnetic field MF1 exit the magnetic poles 4a opposed to the side surface 3b of the target 3 and extend at an acute angle (specifically, acute angle of 45 degrees or less in FIGS. 4 to 5) with respect to the side surface 3b of the target 3, in the vicinity of the front end surface 3a within side surface 3b of the target 3 (specifically, in a region of up to 10 mm from the front end surface 3a of the target 3). In summary, the magnetic lines of force FL1 extend outward in the radial direction B while approaching the front end surface 3a of the target 3 in the side surface 3b of the target 2, in a region of up to 10 mm from the front end surface 3a. Furthermore, in this region, the magnetic lines of force FL1 keep their high density (i.e., the magnetic flux density thereof is high).

The magnetic field MF1 satisfies, in a region of up to 10 mm from the front end surface 3a of the target 3 in the axial direction A of the target 3, the following conditions a) and b):

a) an angle θ which the magnetic lines of force FL1 of the magnetic field MF1 forms with the side surface 3b of the target 3 is of 45 degrees or less; and b) a component Bx of the strength of the magnetic lines of force FL1 along the axial direction A of the target 3 is 200 G or more.

Satisfying the above conditions a) and b), the magnetic lines of force FL1 (FIGS. 4 to 5) on the side surface 3b of the target 3, in the vicinity of the front end surface 3a of the target 3, i.e., in a region of up to 10 mm from the front end surface 3a, act on the arc spot S so as to push back the arc spot S into the area of the front end surface 3a, even when the arc spot S shown in FIGS. 2 to 3 tends to deviate from the area of the front end surface 3a of the target 3 made of carbon. The arc spot S is thereby constrained within the area of the front end surface 3a of the target 3 made of carbon, being prevented from deviating from the area of the front end surface 3a of the target 3.

Furthermore, being disposed so as to generate a magnetic field that satisfies conditions a) and b) above, each of the individual magnets 4 is not required to be upsized for generating strong magnetic forces. This makes it possible to restrict upsizing the arc evaporation source 1.

Besides, the target 3 being rod-shaped allows film formation to be performed continuously over a prolonged period of time corresponding to the length of the target 3.

In the present embodiment using a carbon-made target as the target 3, the arc spot S makes a more unstable movement to thus tend to deviate from the front end surface 3a of the arc spot S. However, the magnets 4 generating a magnetic field that satisfies conditions a) and b) above allows the arc spot S to be retained stably on the front end surface 3a of the target 3 in spite of use of the carbon-made target 3.

For generating the magnetic field MF1 satisfying conditions a) and b) of the present embodiment, the plurality of magnets 4 according to the present embodiment are disposed so as to align mutually different magnetic poles 4a, 4b of the magnets 4 in the radial direction B of the target 3, on the side of the target 3 made of carbon. This allows each of the magnets 4 to be small even though strong magnetic lines of force FL1 at an acute angle of 45 degrees or less with respect to the side surface 3b of the target 3 should be generated, thereby enabling the whole apparatus of the arc evaporation source 1 to be reliably downsized.

Figure 8:
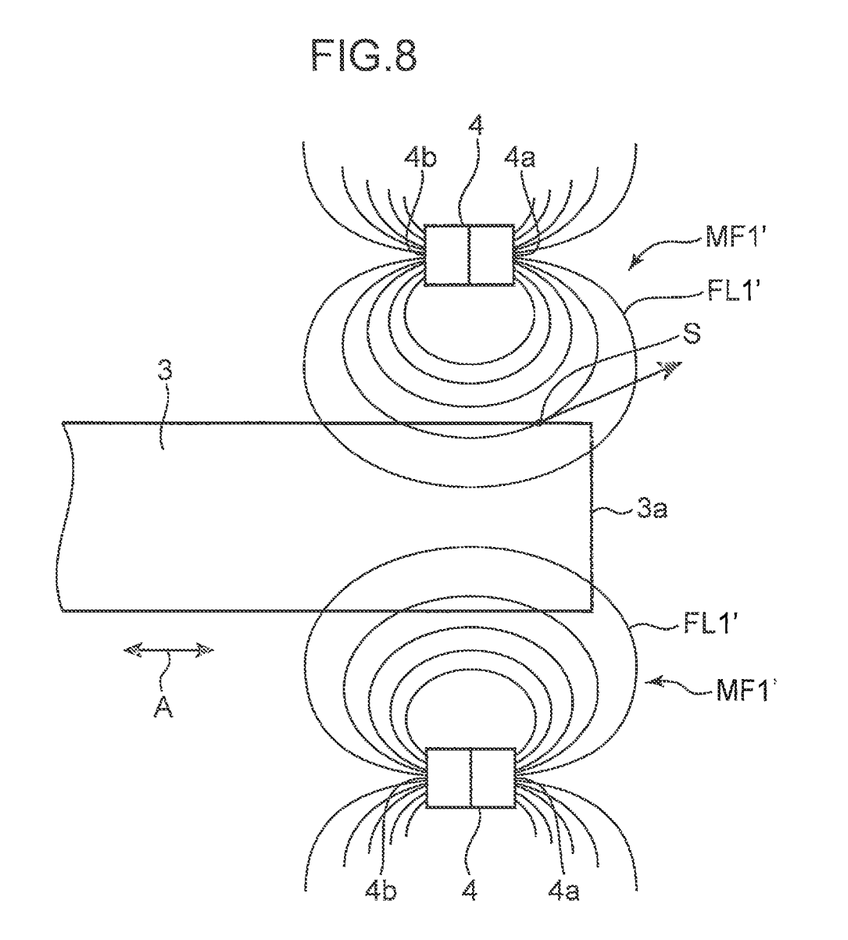
FIG. 8 is a diagram of an enlarged portion between a target front end surface and a magnet in a variation of the present invention, where magnets are disposed so as to align the magnetic poles thereof in the axial direction of the target.

It is also permissible to dispose the magnets 4 so as to align the magnetic poles 4a (for instance N-poles) and the magnetic poles 4b (for instance S-poles) of mutually different polarities in the axial direction A of the target 3, as shown in FIG. 8. In this case as well, disposing the magnets 4 so as to generate a magnetic field MF1' satisfying conditions a) and b) above allows the magnetic lines of force FL1' on the side surface 3b of the target 3 in the vicinity of the front end surface 3a of the target 3, i.e., in a region of up to 10 mm from the front end surface 3a, to act on the arc spot S so as to push back the arc spot S into the area of the front end surface 3a even when the arc spot S tends to deviate from the area of the front end surface 3a of the carbon-made target 3. Furthermore, each of the magnets 4 shown in FIG. 8 is capable of generating a strong magnetic force, thus not being required to be upsized in order to generate strong magnetic forces. This makes it possible to restrict upsizing of the arc evaporation source 1. Thus aligning the magnetic poles 4a, 4b in the axial direction of the target 3 causes electrons emitted from the front end surface 3a of the target 3 to flow towards the magnetic poles 4a near the front end surface 3a, along the magnetic lines of force FL1', thereby heating up the portions of the magnetic poles 4a of the magnets 4 as anodes; therefore, it is preferable to cool the portions of the magnetic poles 4a by a cooling mechanism relying for instance on water cooling.

In the case where the magnets 4 are disposed so as to align the magnetic poles 4a and the magnetic poles 4b of mutually different polarities in the axial direction A of the target 3, as described above, it is also permissible to form the magnets 4 into a ring shape or to dispose a plurality of magnets 4 circumferentially around the target 3, as shown in FIG. 8. Only one of above ring-shaped magnet is required; thus, it is permissible that the ring-shaped magnet is just single.

Preferably, the component Bx of the strength of the magnetic lines of force FL1 along the axial direction A of the target 3 is 500 G or more. Such magnetic lines of force FL1 is able to push back more reliably the arc spot S into the area of the front end surface 3a of the target 3 made of carbon.

The above-described Conditions a) and b) will be explained below in further detail.

Figure 6:
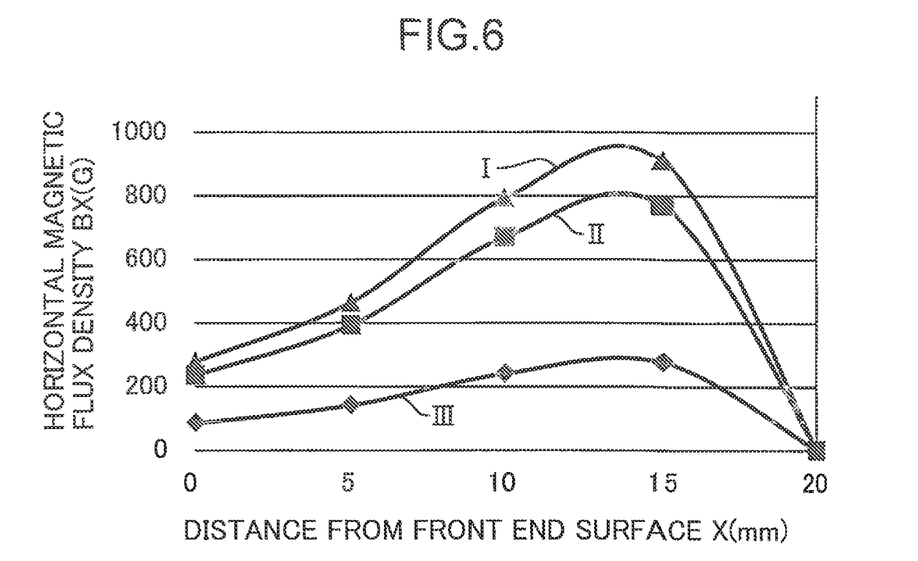
FIG. 6 is a graph showing the relationship between distance from the front end surface of the target of FIG. 1 and horizontal magnetic flux density.

FIG. 6 depicts a graph showing the relationship, in the case of disposing the magnets 4 in a radial arrangement as shown in FIG. 4, between the distance X (mm) from the front end surface 3a of the target of FIG. 1 and a horizontal magnetic flux density Bx (units G (=×10$^{-4}$ T)) of the magnetic field MF1 that is formed by the magnets 4. In FIG. 6, the component Bx of the axial direction A of the target 3 in the strength of the magnetic lines of force FL1 is indicated as the horizontal magnetic flux density Bx.

The curve I in the graph of FIG. 6 represents the horizontal magnetic flux density Bx of the magnets 4 of the present embodiment made up of permanent magnets produced by use of an alloy (NdFeB) containing neodymium. The curve I represents a horizontal magnetic flux density Bx of 200 G or more, specifically a horizontal magnetic flux density Bx of 230 to 800 G, in a region of 0 to 10 mm of the distance X from the front end surface 3a of the target 3. This teaches that strong magnetic lines of force enough to push back the arc spot S to the front end surface 3a are generated in the region. Besides, the curve I represents a horizontal magnetic flux density Bx of 800 G or more in the region of distance X from 10 to 16 mm, thus teaching that very strong magnetic lines of force are generated in the region. In this region, the magnetic lines of force is so strong that the arc spot S can be pushed back more reliably, by magnetic forces, to the front end surface 3a.

The curve II of the graph of FIG. 6 represents the horizontal magnetic flux density Bx of the magnets 4 of the present embodiment made up of permanent magnets produced by use of an alloy of samarium and cobalt (SmCo). The curve II represents a horizontal magnetic flux density Bx of 200 G or more, specifically 210 to 620 G, in a region of 0 to 10 mm of the distance X from the front end surface 3a of the target 3, thus teaching that there are generated, in the region, strong magnetic lines of force capable of pushing back the arc spot S to the front end surface 3a. Besides, the curve II depicts a horizontal magnetic flux density Bx of 800 G or more in a region of 13 to 14 mm of the distance X.

In the region of 0 to 14 mm of the distance X from the front end surface 3a of the target 3 in the curves I and II of the graph of FIG. 6, the component Bx of the strength of the magnetic lines of force FL1 along the axial direction A of the target 3 increases with increase in distance from the front end surface 3a of the target 3 in the axial direction A of the target 3. The magnetic lines of force FL1 thereby become stronger with increase in the distance from the front end surface 3a of the target 3 in the axial direction A of the target 3. This makes it possible to reliably push back the arc spot S to the front end surface 3a of the target 3 so as to inhibit the arc spot S from remaining on the side surface 3b, by the action of magnetic forces, even when the arc spot S has deviated from the front end surface 3a of the target 3 towards the side surface 3b of the target 3.

In other words, the effect of pushing back the arc spot S on the side surface 3b of the carbon-made target 3 greatly relies on the horizontal component strength Bx of the magnetic lines of force FL1. If there exists a place where the horizontal component strength Bx on the side surface 3b is locally weak, the arc spot S in the place is likely to make unintended behavior, and the position of the arc spot S becomes hard to control. Therefore, if distributed so that the horizontal component strength Bx of the magnetic lines of force FL1 increases uniformly in a monotonic fashion, the magnetic lines of force FL1 can reliably push back the arc spot S to the front end surface 3a of the target 3.

In addition, the curve III of the graph of FIG. 6 represents, as a reference example, the horizontal magnetic flux density Bx of a magnet made up of an existing permanent magnet containing iron (Fe) as a main starting material. A comparison of curve III versus curves I, II reveals that the horizontal magnetic flux density Bx is lower in a whole region of 0 to 20 mm of the distance X from the front end surface 3a of the target 3. The horizontal magnetic flux density Bx is 200 G or less in the greater part of the region of 0 to 10 mm of the distance X, which teaches that such existing permanent magnets made of iron is incapable of yielding magnetic lines of force strong enough to push back the arc spot S to the front end surface 3a.

Figure 7:
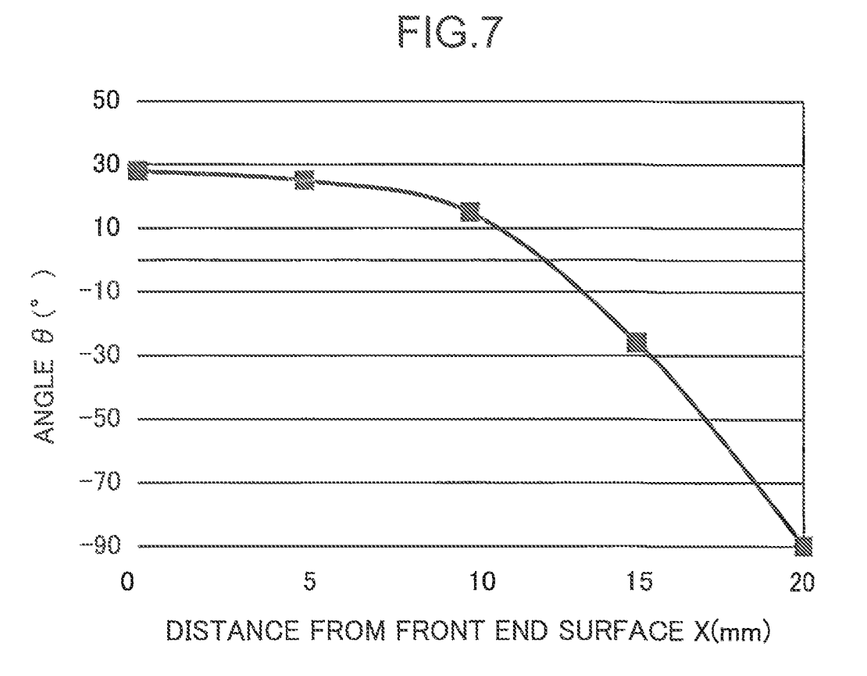
FIG. 7 is a graph showing the relationship between distance from the front end surface of the target of FIG. 1 and the angle of magnetic lines of force with respect to the side surface of the target.

FIG. 7 depicts a graph showing the relationship, in the case of the radial arrangement of the magnets 4 as shown in FIG. 4, between the distance X (mm) from the front end surface 3a of the target 3 in FIG. 1 and the angle θ of the magnetic lines of force FL1 with respect to the side surface 3b of the target 3. The graph of FIG. 7 reveals that the angle θ lies within an acute angle range from 0 to 30 degrees, in a region of 0 to 12 mm of the distance X from the front end surface 3a of the target 3, the magnetic lines of force FL1 having an angle acute enough to push back the arc spot S to the front end surface 3a.

As described above, the experiments made by the inventors have confirmed that the configuration where magnets 4 made up of permanent magnets produced by use of an alloy containing neodymium (NdFeB) or of an alloy containing samarium and cobalt (SmCo) are disposed in a radial arrangement as shown in FIGS. 4 to 5 can generate magnetic lines of force MF1 that satisfy conditions a) and b) above to thereby prevent the arc spot S from deviating from the area of the front end surface 3a of the target 3.

Figure 9:
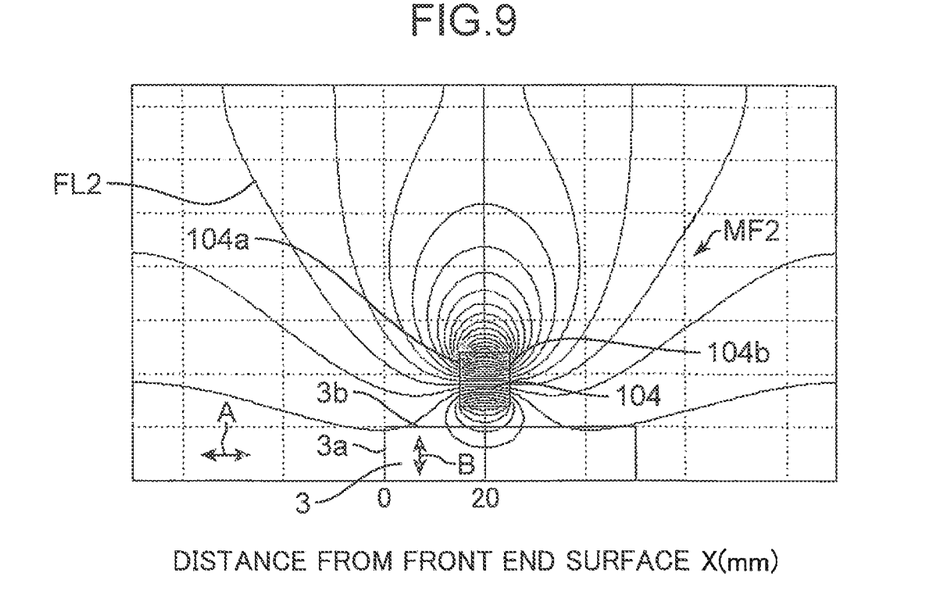
FIG. 9 is a diagram showing a state in which magnets with different magnetic poles aligned in the axial direction of the target generate a magnetic field not satisfying magnetic field generation conditions a) and b) according to the present invention, as a comparative example of the present invention.

Besides, next will be contemplated, as a conceivable comparative example of the present invention, a configuration which generates a magnetic field that does not satisfy the above conditions a) or b) above, which are magnetic field generation conditions of the present invention, in the case where magnets 104 made up of permanent magnets are disposed in the axial direction A of the target 3 as shown in FIG. 9.

In the configuration shown in FIG. 9, the magnets 104 are disposed apart from the side surface 3b of the target 3 and so as to align magnetic poles 104a, 104b in the axial direction A of the target 3. This allows the magnets 104 to generate a magnetic field MF2 shown in FIG. 9 on the side surface 3b of the target 3. In FIG. 9, the magnets 104 are disposed so as to locate the axially center of the magnets 104 at a position 20 mm rearward from the front end surface 3a of the target 3.

The magnetic lines of force FL2 of the magnetic field MF2, though exiting the magnetic poles 104a facing the front end surface 3a of the target 3, penetrate into the target 3 through the side surface 3b of the target 3 in the vicinity of the front end surface 3a on the side surface 3b of the target 3 (specifically, in a region of up to about 6 mm from the front end surface 3a of the target 3). In summary, the magnetic lines of force FL2 extend inward in the radial direction B while approaching the front end surface 3a of the target 2, on the side surface 3b, in a region of up to about 6 mm from the front end surface 3a of the target 3. In addition, the magnetic lines of force FL2 are sparse (i.e., the magnetic flux density is low) in the region.

Figure 10:
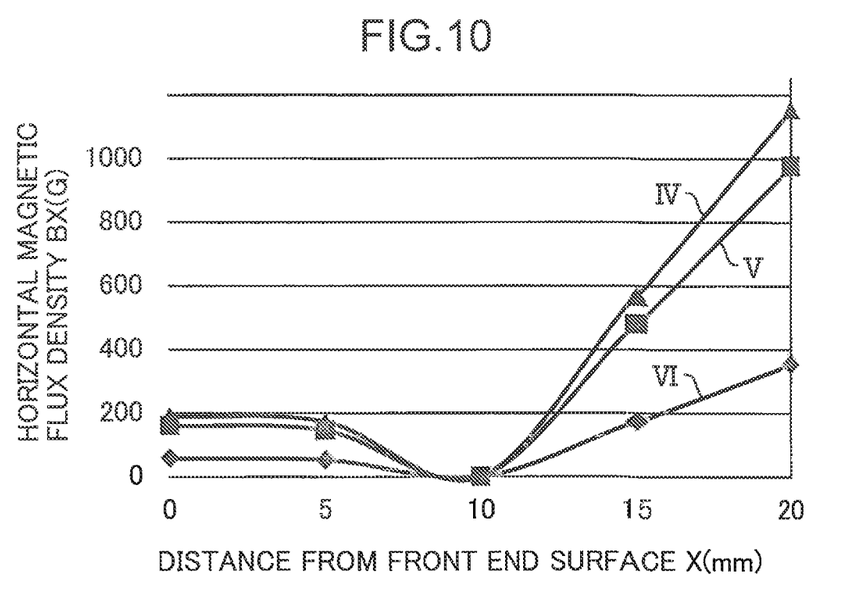
FIG. 10 is a graph showing the relationship between distance from the front end surface of the target of FIG. 9 and horizontal magnetic flux density.

FIG. 10 depicts a graph showing the relationship, in the case where the magnets 104 are disposed in the axial direction of the target 3 as shown in FIG. 9, between the distance X (mm) from the front end surface 3a of the target 3 and the horizontal magnetic flux density Bx (units G ($=\times 10^{-4}$ T)) of the magnetic field MF2 that is formed by the magnets 4.

The curve IV in the graph of FIG. 10 represents the horizontal magnetic flux density Bx of the magnets 104 made up of permanent magnets produced by use of an alloy (NdFeB) containing neodymium. The curve V represents a horizontal magnetic flux density Bx of the magnets 104 made up of permanent magnets produced by use of an alloy of samarium and cobalt (SmCo). The curve VI represents the horizontal magnetic flux density Bx of the magnets 104 made up of permanent magnets containing iron (Fe) as a main starting material.

The curves IV to VI reveal that the horizontal magnetic flux density Bx is kept at a low value smaller than 200 G in a region of 0 to 10 mm of the distance X from the front end surface 3a of the target 3. In the region, since the strength of the magnetic lines of force FL2 is thus small, the are spot S seems to be hard to push back to the front end surface 3a.

Figure 11:
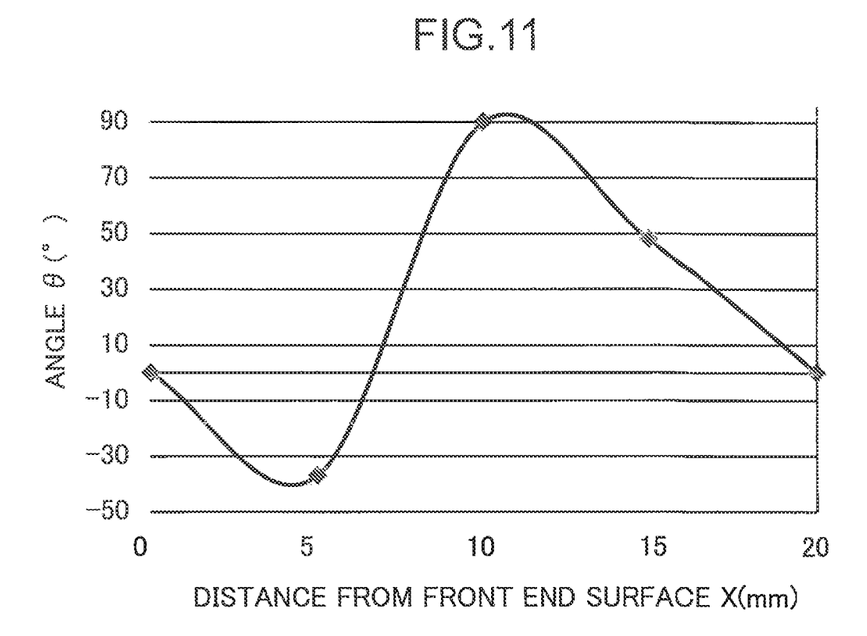
FIG. 11 is a graph showing the relationship between distance from the front end surface of the target of FIG. 9 and the angle of magnetic lines of force with respect to the side surface of the target.

FIG. 11 depicts a graph showing the relationship, in the case where the magnets 104 are disposed in the axial direction of the target 3 as shown in FIG. 9, between the distance X (mm) from the front end surface 3a of the target 3 and the angle θ of the magnetic lines of force FL2 with respect to the side surface 3b of the target 3. As can be grasped from the graph of FIG. 11, the angle θ is 0 degrees or smaller in a region of 0 to 6 mm of the distance X from the front end surface 3a of the target 3. In summary, the magnetic lines of force FL2 extend inward in the radial direction B while approaching the front end surface 3a to penetrate into the target 3, on the side surface 3b of the target 3, in a region of up to 6 mm from the front end surface 3a of the target 3. Hence, it is deemed that the magnetic lines of force FL2 that penetrate into the target 3 elicit a weak action of pushing back the arc spot S to the front end surface 3a, on the side surface 3b of the target 3.

It is thus found that disposing the magnets 104 in the axial direction A of the target 3 as shown in FIG. 9 makes it difficult to construct a configuration in which the magnetic field MF2 formed by the magnets 104 satisfies the above conditions a) and b) in a region of up to 10 mm from the front end surface 3a of the target 3 in the axial direction A of the target 3. It is accordingly deemed that it is difficult to push back the are spot S into the area of the front end surface 3a of the target 3 by the magnetic lines of force FL2 on the side surface 3b of the target 3 in the case of not satisfying the above conditions a) or b) as shown in FIGS. 9 to 11.

Furthermore, the experiments made by the inventors have confirmed that the configuration where such magnets 104 are disposed in the axial direction A of the target 3 is incapable of preventing the arc spot S from deviating from the area of the front end surface 3a of the target 3, differently from the configuration shown in FIGS. 4 to 5 of the present embodiment where the magnets 4 are disposed in a radial arrangement, even using permanent magnets produced of an alloy containing neodymium (NdFeB) or an alloy containing samarium and cobalt (SmCo).

Therefore, it is found that satisfying the above magnetic field generation conditions a) and b) is more easily accomplished in a configuration where the magnets 4 are disposed so as to align the magnetic poles 4a, 4b of mutually different polarities in the radial direction of the target 3 as shown in FIGS. 4 to 5 than in a configuration where the magnets 104 are disposed so as to align the magnetic poles 104a, 104b in the axial direction of the target 3 as shown in FIG. 9. Accordingly, it is found that the configuration where the magnets 4 are disposed in a radial arrangement as shown in FIGS. 4 to 5 is capable of constraining the arc spot S on the front end surface 3a of the target 3 more stably and allowing the arc evaporation source 1 to be reliably achieved.

About the above embodiments, the explanation is made with taking a carbon-made target as an example of the target 3; the present invention is, however, not limited thereto. The target 3 is also permitted to contain tungsten carbide, tungsten, molybdenum or niobium. Also on a target 3 made of tungsten carbide or the like, an arc spot tends to make an unstable movement similarly to the case of the above carbon-made target 3. However, the generation of a magnetic field that satisfies the conditions a) and b) by the magnets as described above makes it possible to stably retain the are spot on the front end surface of the target 3 even with use of a carbon-made target 3. Since a target 3 made of tungsten carbide or the like is expensive, the consummation pattern and the yield of the target 3 are of great concern. The use of tungsten carbide or the like as the rod-shaped target 3 for the arc evaporation source 1 is effective in making the consumption of the target 3 uniform (that is, allowing the target 3 to be consumed uniformly over the entire front end surface thereof) and in enhancing yield.

In the above-described specific embodiments, mainly lies an invention having the features below.

The arc evaporation source according to the present embodiment includes:

a target to be melted and evaporated from a front end surface of the target by arc discharge; and at least one magnet disposed at a position apart from a side surface of the target radially of the target, the side surface being continuous with a periphery of the front end surface of the target, wherein the magnet is disposed so as to form a magnetic field that satisfies conditions a) and b) below, on the side surface of the target, in a region of up to 10 mm from the front end surface of the target in an axial direction of the target, the axial direction being normal to the front end surface:

a) an angle which magnetic lines of force of the magnetic field forms with the side surface of the target is 45 degrees or less; and b) a component of the strength of the magnetic lines of force along the axial direction of the target is 200 G or more.

According to the above configuration, the magnetic field generated by the magnet satisfying the above conditions a) and b) above, allows the magnetic lines of force on the side surface of the target in the vicinity of the front end surface of the target, i.e., in a region of up to 10 mm from the front end surface, to act on the arc spot so as to push back the arc spot back into the area of the front end surface even when the arc spot tends to deviate from the area of the front end surface of the target. The arc spot is thereby constrained within the area of the front end surface of the target.

Furthermore, disposing the magnet so as to generate a magnetic field that satisfies the above conditions a) and b) eliminates the need for upsizing the magnet in order to generate strong magnetic forces. This allows upsizing the apparatus to be restricted.

Preferably, the target is rod-shaped. This allows film deposition to be performed continuously over a prolonged period of time corresponding to the length of the rod-shaped target.

The target may contain carbon. According to a carbon-made target, the arc spot makes a more unstable movement, tending to deviate from the front end surface of the arc spot. However, the generation of the magnetic field satisfying the above conditions a) and b) by the magnet makes it possible to retain the arc spot stably on the front end surface of the target even with use of a carbon-made target.

The target may contain tungsten carbide, tungsten, molybdenum or niobium. Also on a target made of tungsten carbide or the like, the arc spot tends to make an unstable movement, as is the case of the above carbon-made target. However, the above-described generation of the magnetic field satisfying the above conditions a) and b) by the magnet makes it possible to retain the arc spot stably on the front end surface of the target, even with the use of a target made of tungsten carbide or the like. Since a target made of tungsten carbide or the like is expensive, especially the consummation pattern and the yield of the target are of great concern. The use of tungsten carbide or the like as the rod-shaped target for the arc evaporation source is effective in making the consumption of the target uniform and in enhancing yield.

Preferably, the magnet has magnetic poles of mutually different polarities, and the magnet is disposed so as to align the magnetic poles of mutually different polarities in the radial direction of the target. In the case where the magnet is disposed so as to align the mutually different magnetic poles in the radial direction of the target, on the side of the target, as the arrangement of the magnet for generating the magnetic field that satisfies conditions a) and b), one of the magnetic poles of the magnet is opposed to the side surface of the target while the other magnetic pole faces outward in the radial direction of the target. This enables the magnetic pole opposed to the side surface of the target to generate, on the side surface of the target, such strong magnetic lines of force at an acute angle of 45 degrees or less as to satisfy the above conditions a) and b), in a region of up to 10 mm from the front end surface. In other words, disposing the magnets in the above way allows the individual magnet to be small while still generating strong magnetic lines of force at an acute angle of 45 degrees or less with respect to the side surface of the target, thus allowing the whole apparatus of the arc evaporation source to be reliably downsized.

It is also permissible that the magnet have magnetic poles of mutually different polarities and the magnet is disposed so as to align the magnetic poles of mutually different polarities in the axial direction of the target. Also in this case, disposing the magnets so as to generate a generate strong magnetic forces field that satisfies conditions a) and b) eliminates the need for upsizing the magnet, which is enabled to generate a strong magnetic force. This allows upsizing an apparatus to be restricted.

The component of the strength of the magnetic lines of force along the axial direction of the target is preferably 500 G or more.

Such magnetic lines of force is capable of pushing back the arc spot more reliably into the area of the front end surface of the target.

The component of the strength of the magnetic lines of force along the axial direction of the target is preferably increased with increase in distance from the front end surface of the target in the axial direction of the target.

According to this configuration, the magnetic lines of force become stronger with increase in distance from the front end surface of the target in the axial direction of the target. This makes it possible to push back the arc spot reliably to the front end surface by the action of magnetic forces so as to inhibit the arc spot from remaining on the side surface, even when the arc spot has deviated from the front end surface of the target to the side surface of the target.

Preferably, the magnetic field has a place at which the component of the strength of the magnetic lines of force along the axial direction of the target is 800 G or more, on the side surface of the target, in a region of up to 20 mm from the front end surface of the target in the axial direction of the target.

This configuration makes it possible to push back the arc spot more reliably to the target front end surface through the action of magnetic forces so as to inhibit the arc spot from remaining on the side surface of the target.

The magnet is preferably a permanent magnet.

This allows the magnet to be downsized than an electromagnet having a coil. This allows degree of the flexibility of arrangement of the magnet to be increased and allow downsizing of the arc evaporation source to be achieved more reliably.

The permanent magnet preferably contains neodymium.

The permanent magnets containing neodymium is able to generate strong magnetic lines of force that satisfy the above conditions a) and b) despite its small size.

Preferably, a plurality of the magnets are spaced at regular intervals in a circumferential direction of the target.

This allows the magnetic field generated by the magnets to be distributed uniformly in the circumferential direction of the target, on the target side surface, thus making it possible to eliminate portions where the magnetic lines of force are locally weak to cause a possibility of permitting the arc spot to remain on the side surface of the target. This results in the ability to push back the arc spot to the target front end surface more reliably, through the action of magnetic forces.

The magnet is preferably disposed on a rear side of the front end surface of the target, in the axial direction of the target.

Thus disposing the magnets makes it possible to reliably generate a magnetic field that satisfies the above conditions a) and b) and further to allay the concern of adhesion, onto the magnets, of molten material flying off the front end surface of the target.

The invention claimed is:

1. An arc evaporation source, comprising:
   a target to be melted and evaporated from a front end surface of the target by arc discharge; and
   three or more magnets disposed at a position apart from a side surface of the target radially of the target, the side surface being continuous with a periphery of the front end surface of the target,
   wherein the target has a cylindrical shape being defined by the front end surface, a back end surface, and the side surface which defines a length of the target, the front end surface and back end surface being separated by the side surface, which joins the front end surface and back end surface,
   the front end surface of the target having a flat portion and having a circular cross-section when viewed along an axial direction to the target,
   the length of the target being greater than a diameter of the front end surface,
   each of the three or more magnets is disposed so as to form a magnetic field that satisfies conditions a) and b) below, on the side surface of the target, in a region of up to 10 mm from the front end surface of the target in an axial direction of the target, the axial direction being normal to the front end surface:
   a) an angle which magnetic lines of force of the magnetic field forms with the side surface of the target is 45 degrees or less, the magnetic lines of force of the magnetic field extending outward in the radial direction of the target while approaching the front end surface of the target on the side surface of the target; and
   b) a component of the strength of the magnetic lines of force along the axial direction of the target is 200 G or more,
   wherein the three or more magnets are spaced at regular intervals around the center axis of the target having the circular cross-section in a circumferential direction of the target at an axial position that is apart from the front end surface backward of the target.

2. The arc evaporation source according to claim 1, wherein the target contains carbon.

3. The arc evaporation source according to claim 1, wherein the target contains tungsten carbide, tungsten, molybdenum or niobium.

4. The arc evaporation source according to claim 1, wherein
   each of the three or more magnets has magnetic poles of mutually different polarities, and
   each of the three or more magnets is disposed so as to align the magnetic poles of mutually different polarities in the radial direction of the target.

5. The arc evaporation source according to claim 1, wherein
   each of the three or more magnets has magnetic poles of mutually different polarities, and
   each of the three or more magnets is disposed so as to align the magnetic poles of mutually different polarities in the axial direction of the target.

6. The arc evaporation source according to claim 1,
wherein the component of the strength of the magnetic lines of force along the axial direction of the target is increased with increase in distance from the front end surface of the target in the axial direction of the target.

7. The arc evaporation source according to claim 1,
wherein each of the three or more magnets is a permanent magnet.

8. The arc evaporation source according to claim 7,
wherein the permanent magnet contains neodymium.

9. The arc evaporation source according to claim 1,
wherein each of the three or more magnets is disposed on a rear side of the front end surface of the target, in the axial direction of the target.

10. The arc evaporation source according to claim 1, further comprising a shield plate arranged circumferentially around the side surface of the target and arranged between the front end surface of the target and the three or more magnets.

11. The arc evaporation source according to claim 1,
wherein the three or more magnets are each arranged at the same distance from the front end surface of the target in the axial direction.

12. An arc evaporation source, comprising:
a target to be melted and evaporated from a front end surface of the target by arc discharge; and
three or more magnets disposed at a position apart from a side surface of the target radially of the target, the side surface being continuous with a periphery of the front end surface of the target,
wherein the target has a cylindrical shape being defined by the front end surface, a back end surface, and the side surface which defines a length of the target, the front end surface and back end surface being separated by the side surface, which joins the front end surface and back end surface,
the front end surface of the target having a flat portion and having a circular cross-section when viewed along an axial direction to the target,
the length of the target being greater than a diameter of the front end surface,
each of the three or more magnets is disposed so as to form a magnetic field that satisfies conditions a) and b) below, on the side surface of the target, in a region of up to 10 mm from the front end surface of the target in an axial direction of the target, the axial direction being normal to the front end surface:
a) an angle which magnetic lines of force of the magnetic field forms with the side surface of the target is 45 degrees or less,
b) a component of the strength of the magnetic lines of force along the axial direction of the target is 500 G or more,
wherein the three or more magnets are spaced at regular intervals around the center axis of the target having the circular cross-section in a circumferential direction of the target at an axial position that is apart from the front end surface backward of the target.

13. An arc evaporation source, comprising:
a target to be melted and evaporated from a front end surface of the target by arc discharge; and
three or more magnets disposed at a position apart from a side surface of the target radially of the target, the side surface being continuous with a periphery of the front end surface of the target,
wherein the target has a cylindrical shape being defined by the front end surface, a back end surface, and the side surface which defines a length of the target, the front end surface and back end surface being separated by the side surface, which joins the front end surface and back end surface,
the front end surface of the target having a flat portion and having a circular cross-section when viewed along an axial direction to the target,
the length of the target being greater than a diameter of the front end surface,
each of the three or more magnets is disposed so as to form a magnetic field that satisfies conditions a) and b) below, on the side surface of the target, in a region of up to 10 mm from the front end surface of the target in an axial direction of the target, the axial direction being normal to the front end surface:
a) an angle which magnetic lines of force of the magnetic field forms with the side surface of the target is 45 degrees or less,
b) the magnetic field has a place at which the component of the strength of the magnetic lines of force along the axial direction of the target is 800 G or more,
wherein the three or more magnets are spaced at regular intervals around the center axis of the target having the circular cross-section in a circumferential direction of the target at an axial position that is apart from the front end surface backward of the target.

\* \* \* \* \*